United States Patent [19]

Kaufman

[11] Patent Number: 4,924,292

[45] Date of Patent: May 8, 1990

[54] DIRECT BOND CIRCUIT ASSEMBLY WITH CRIMPED LEAD FRAME

[76] Inventor: Lance R. Kaufman, 131 N. White Oak Way, Mequon, Wis. 53092

[21] Appl. No.: 328,543

[22] Filed: Mar. 24, 1989

Related U.S. Application Data

[62] Division of Ser. No. 180,541, Apr. 12, 1988.

[51] Int. Cl.$^5$ .................... H01L 21/48; H01L 21/60
[52] U.S. Cl. .................................. 357/70; 357/80
[58] Field of Search ............... 357/70, 80; 29/827; 437/220

[56] References Cited

U.S. PATENT DOCUMENTS

| | | | |
|---|---|---|---|
| 3,597,666 | 8/1971 | Taskovich | 357/70 |
| 3,744,120 | 7/1973 | Burgess et al. | 29/494 |
| 3,766,634 | 10/1973 | Babcock et al. | 29/471.9 |
| 3,854,892 | 12/1974 | Burgess et al. | 29/196.1 |
| 3,911,553 | 10/1975 | Burgess et al. | 228/173 |
| 3,958,075 | 5/1976 | Kaufman | 174/16 HS |
| 3,993,411 | 11/1976 | Babcock et al. | 403/201 |
| 3,994,430 | 11/1976 | Cusano et al. | 228/122 |
| 4,129,243 | 12/1978 | Cusano et al. | 228/122 |
| 4,156,148 | 5/1979 | Kaufman | 250/551 |
| 4,189,085 | 2/1980 | Penrod | 437/220 |
| 4,196,411 | 4/1980 | Kaufman | 338/314 |
| 4,215,235 | 7/1980 | Kaufman | 174/52 PE |
| 4,218,724 | 8/1980 | Kaufman | 361/395 |
| 4,250,481 | 2/1981 | Kaufman | 338/163 |
| 4,266,140 | 5/1981 | Kaufman | 250/551 |
| 4,394,530 | 7/1983 | Kaufman | 176/16 HS |
| 4,445,271 | 5/1984 | Grabbe | 29/589 |
| 4,449,165 | 5/1984 | Kaufman | 361/386 |
| 4,449,292 | 5/1984 | Kaufman | 29/631 |
| 4,488,202 | 12/1984 | Kaufman | 361/386 |
| 4,498,120 | 2/1985 | Kaufman | 361/386 |
| 4,500,029 | 2/1985 | Yerman | 228/123 |
| 4,546,410 | 10/1985 | Kaufman | 361/387 |
| 4,546,411 | 10/1985 | Kaufman | 361/387 |
| 4,554,613 | 11/1985 | Kaufman | 361/386 |
| 4,574,162 | 3/1986 | Kaufman | 174/16 HS |
| 4,577,387 | 3/1986 | Kaufman | 29/458 |
| 4,630,174 | 12/1986 | Kaufman | 361/388 |
| 4,700,273 | 10/1987 | Kaufman | 361/388 |
| 4,713,723 | 12/1987 | Kaufman | 361/179 |
| 4,724,514 | 2/1988 | Kaufman | 361/388 |
| 4,739,449 | 4/1988 | Kaufman | 361/388 |
| 4,779,060 | 10/1988 | Henden | 330/277 |
| 4,788,765 | 12/1988 | Kaufman et al. | 29/827 |
| 4,819,042 | 4/1989 | Kaufman | 357/80 |
| 4,827,328 | 5/1989 | Ozawa et al. | 357/80 |
| 4,831,723 | 5/1989 | Kaufman | 29/827 |

FOREIGN PATENT DOCUMENTS

| | | | |
|---|---|---|---|
| 231347 | 11/1985 | Japan | 29/827 |
| 0176143 | 8/1986 | Japan | . |
| 0219646 | 9/1987 | Japan | 357/70 |
| 0131558 | 6/1988 | Japan | . |
| 0179557 | 7/1988 | Japan | . |

OTHER PUBLICATIONS

"Over 50 Years of Experience with the Direct Bond Copper Process.", Tegmen Corp., 1201 East Fayette Street, Syracuse, New York 13210.

*Primary Examiner*—Andrew J. James
*Assistant Examiner*—Viet Q. Nguyen
*Attorney, Agent, or Firm*—Andrus, Sceales, Starke & Sawall

[57] ABSTRACT

An electric circuit assembly (10) includes a ceramic substrate (14), a copper lead frame (20) having pad portions (22, 24, 26) directly bonded on the substrate, crimped portions (28, 30, 32) extending from the pad portions in a humped configuration above the substrate, and extension portions (34, 36, 38) extending from the crimped portions laterally beyond the substrate. The crimped portions prevent bonding of the extension portions to the substrate, to enable upward bending of the extension portions and crimped portions along bend lines (54) spaced laterally inwardly of the outer edge (18) of the substrate.

4 Claims, 1 Drawing Sheet

DIRECT BOND CIRCUIT ASSEMBLY WITH CRIMPED LEAD FRAME

This is a division of application Ser. No. 07/180,541, filed Apr. 12, 1988.

BACKGROUND AND SUMMARY

The invention relates to a direct bond electric circuit assembly, and more particularly to an improved assembly structure and manufacturing method in combination.

Electric circuit assemblies in the field of the present invention typically include an electrically insulating thermally conductive non-metallic refractory substrate, e.g. ceramic, having electrically conductive metallic lead frames, e.g. copper, mounted on top of the substrate, and electrical components, e.g. semiconductor chips, mounted on the lead frames. The structure is covered by an insulating housing which in turn is mounted to a heat sink such that the bottom surface of the ceramic substrate is in intimate contact with the heat sink. Examples of such circuit assemblies are shown in U.S. Pat. Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, 4,700,273, 4,713,723, 4,724,514.

The copper lead frames are mounted to the ceramic in various manners, for example by a solder reflow operation, or by a direct bond operation, both of which processes are known in the art.

Direct bonding of the copper to the ceramic involves placing the lead frame in contact with the ceramic, heating the lead frame and the ceramic substrate to a temperature below the melting point of the lead frame to form a eutectic with the lead frame which wets the lead frame and the ceramic substrate, and cooling the lead frame and the substrate with the lead frame bonded to the substrate. The lead frame is pre-oxidized, and the heating is done in an inert atmosphere to form the eutectic, or alternatively the heating is done in a reactive oxygen gas atmosphere to form the eutectic. Direct bond processing is disclosed in U.S. Pat. Nos. 3,744,120, 3,766,634, 3,854,892, 3,911,553, 3,993,411, 3,994,430, 4,129,243. Further reference may be had to "Over 50 years of experience with the Direct Bond Copper process", Tegmen Corp., 1201 East Fayette Street, Syracus, N.Y.

In various circuit assemblies, the lead frame has a pad portion bonded to the substrate, and an extension portion bent upwardly from the pad portion to extend through the housing cover. The upwardly bent extension portion is spaced laterally inwardly of the outer edge of the substrate. A lower shoulder of the cover housing engages the top of the substrate adjacent the edge and clamps the substrate into engagement with the heat sink therebelow, for example as shown in U.S. Pat. No. 4,218,724 at FIG. 6, U.S. Pat. No. 4,394,530 at FIG. 4, U.S. Pat. No. 4,449,165 at FIG. 2, U.S. Pat. No. 4,546,410 at FIG. 3. In these types of structures, the lead frame extension portion should not be allowed to bond to the substrate because this will prevent bending of the lead frame at a band line spaced inwardly of the outer edge of the substrate. In prior solder reflow type bonding operations, solder is merely deleted from beneath the lead frame extension over the substrate to thus prevent such bond. In direct bonding operations, however, the entire copper lead frame is subject to formation of the eutectic upon heating, and hence the entire portion of the lead frame in contact with the ceramic substrate will bond thereto. When attempting to bend the lead frame upwardly at a bend line spaced, laterally inwardly of the outer edge of the substrate, it has been found that the substrate usually breaks or shatters at such bend line due to the bond to the lead frame extension portion thereon.

The present invention addresses and solves the noted problem in a particularly simple and effective manner, and provides a crimped lead frame in combination. Another solution to the noted problem is the subject of co-pending application Ser. No. 07/180,474 filed on even date herewith, entitled "DIRECT BOND CIRCUIT ASSEMBLY WITH GROUND PLANE", to which cross reference is made.

DETAILED DESCRIPTION

Figure 1:
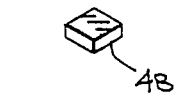
FIG. 1 is a perspective view of an electric circuit assembly in accordance with the invention.
Figure 1:
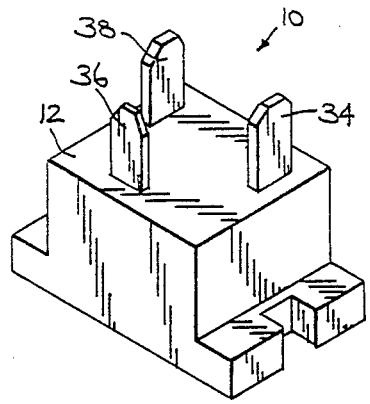
Figure 5:
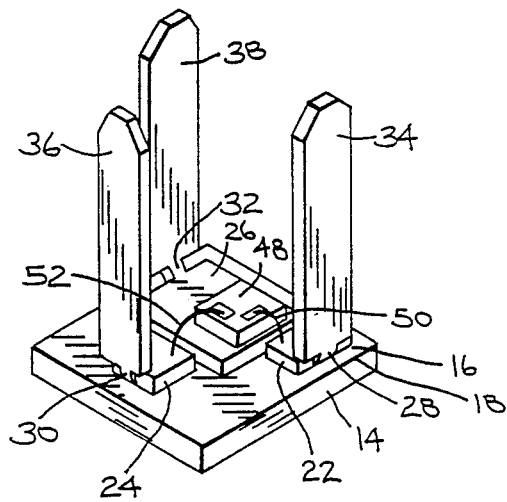
FIG. 5 is a perspective assembled view of the circuit assembly of FIG. 2, absent the housing cover.

FIG. 1 shows an electric circuit assembly 10 including a housing coover 12 which is clamped against a heat sink therebelow (not shown), for which further reference may be had to the above noted circuit assembly patents, incorporated herein by reference. Housing 12 covers an electrically insulating thermally conductive non-metallic refractory base substrate 14, preferably ceramic, and has an inner lower shoulder engaging the top surface 16, FIG. 5, of the substrate adjacent outer edge 18, to clamp substrate 14 into engagement with the heat sink therebelow, as in the above noted patents.

Figure 2:
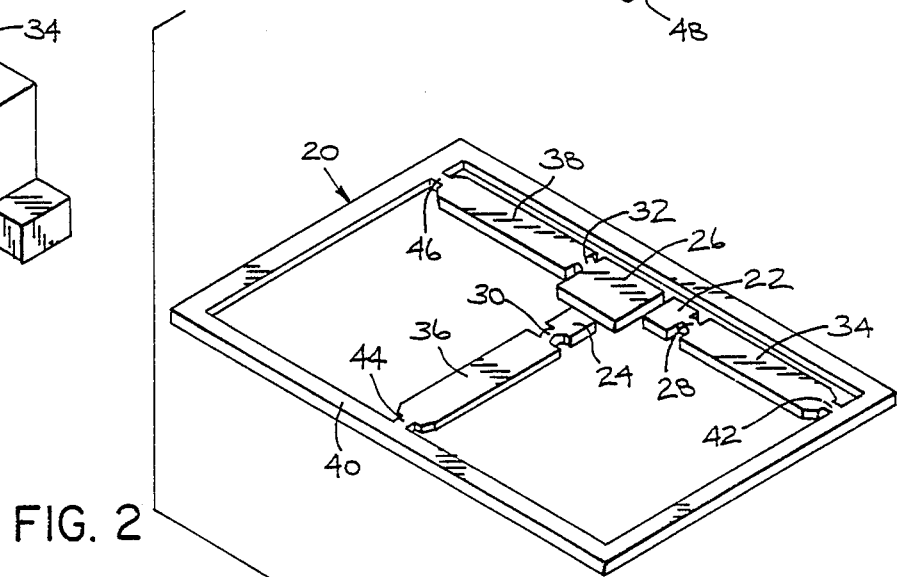
FIG. 2 is an exploded perspective preassembly view of the circuit assembly of FIG. 1, absent the housing cover.
Figure 3:
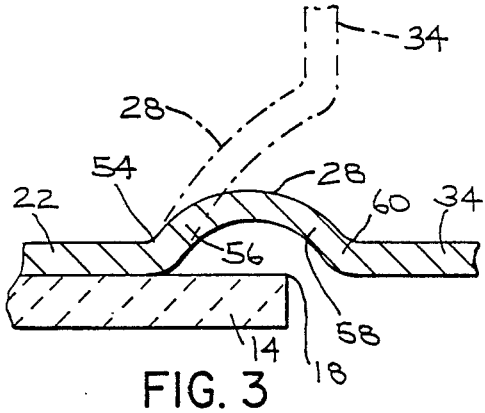
FIG. 3 is a sectional assembled view of a portion of the circuit assembly of FIG. 2.

An electrically conductive metallic lead frame 20, FIG. 2, preferably copper, has had portions 22, 24, 26 on substrate 14, crimped portions 28, 30, 32 extending from respective pad portions and spaced above the substrate, and extension portions 34, 36, 38 extending from respective crimped portions. Lead frame 20 has an outer perimeter 40 connected to extension portions 34, 36, 38 at respective nibs 42, 44, 46, and retaining the lead frame extension portions, crimped portions and pad portions. Lead frame 20 is a substantially flat planar member, with the pad portions, crimped portions and extension portions all substantially co-planar, though crimped portions 28, 30, 32 have a humped configuration raised slightly above the plane of the pad portions and extension portions, as shown in FIG. 3.

Copper lead frame pad portions 22, 24, 26 are directly bonded to ceramic substrate 14 by placing such pad portions in contact with the substrate, heating the lead frame and the substrate to a temperature below the melting point of the lead frame to form a eutectic with the lead frame which wets the lead frame and the substrate, and cooling the lead frame and substrate, with copper lead frame pad portions 22, 24, 26 bonded to ceramic substrate 14, for which further reference may be had to the above noted direct bond process patents, incorporated herein by reference. The lead frame is pre-oxidized, and the heating is done in an inert atmosphere. Alternatively, the heating is done in a reactive oxygen gas atmosphere. The electrical components are then mounted on the lead frames in the desired circuit implementation, for example FET chip 48 is mounted on pad portion 26 as the drain terminal by a solder reflow operation, and jumper wires 50 and 52 are connected to pad portions 22 and 24 to provide source and gate terminal connections. Lead frame nibs 42, 44, 46 are then cut, and lead frame perimeter 40 is removed. Lead frame extension portions 34, 36, 38 and crimped portions 28, 30, 32 are then bent upwardly away from substrate 14 about bend lines such as 54, FIG. 3, spaced laterally inwardly of outer edge 18 of substrate 14.

Figure 4:
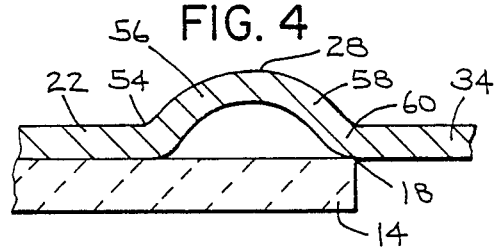
FIG. 4 is a view like FIG. 3 but shows an alternate embodiment.

The spacing of humped crimped portion 28 of the lead frame above substrate 14 prevents bonding therebetween. This facilitates upward bending of lead frame extension portion 34 and crimped portion 28 about bend line 54 laterally inwardly of outer edge 18. Crimped portion 28 has the noted humped configuration with an upward section 56 extending from pad portion 22 upwardly away from substrate 14, and a downward section 58 extending back downwardly towards substrate 14. Lead frame extension portion 34 extends laterally from downward section 58. The junction 60 of extension portion 34 and downward section 58 is proximate outer edge 18 of substrate 14. In the embodiment in FIG. 3, junction 60 is laterally beyond outer edge 18. In an alternate embodiment as shown in FIG. 4, junction 60 touches outer edge 18 of the substrate and is subject to tack bonding therewith during the noted direct bonding step. This tack bond is readily broken, to facilitate the noted upward bending of extension portion 34 and crimped portion 28 at bend line 54 spaced laterally inwardly of outer edge 18 of substrate 14. In a further alternate embodiment, lead frame extension portion 34 in FIG. 3 may sag slightly during the noted direct bonding step such that a tack bond is formed between outer substrate edge 18 and downward section 58 proximate junction 60, which tack bond is likewise readily broken.

It is recognized that various equivalents, alternatives and modifications are possible within the scope of the appended claims.

I claim:
1. An electric circuit assembly comprising:
an electrically insulating thermally conductive nonmetallic refractory substrate;
an electrically conductive metallic lead frame having a pad portion on said substrate, a crimped portion having a humped configuration with an upward section extending upwardly away from said pad portion and a downward section extending back downwardly, and an extension portion extending from said downward section;
said lead frame pad portion being directly bonded to said substrate by placing said lead frame pad portion in contact with said substrate, heating said lead frame and said substrate to a temperature below the melting point of said lead frame to form a eutectic with said lead frame which wets said lead frame and said substrate, and cooling said lead frame and said substrate, with said lead frame pad portion bonded to said substrate.

2. The invention according to claim 1 wherein:
said extension portion of said lead frame extends in a given direction from said downward section of said crimped portion of said lead frame;
said humped configuration of said crimped portion of said lead frame subtends an arc about a given axis;
said given direction is perpendicular to said given axis;
said extension portion and said crimped portion are bent upwardly at a bend line parallel to said given axis and perpendicular to said given direction.

3. The invention according to claim 2 wherein:
said substrate has a given outer edge;
said extension portion of said lead frame and said downward section of said crimped portion of said lead frame meet at a junction spaced outwardly of said given outer edge of said substrate.

4. The invention according to claim 2 wherein:
said substrate has a given outer edge;
said extension portion of said lead frame and said downward section of said crimped portion of said lead frame meet at a junction subject to tack bonding with said substrate at said outer edge during said direct bonding, which tack bond is readily broken, to facilitate upward bending of said extension portion and said crimped portion at said bend line.

* * * * *